United States Patent [19]

Duff et al.

[11] 4,453,033
[45] Jun. 5, 1984

[54] LEAD GROUNDING

[75] Inventors: Raymond J. Duff; Steven A. Tower, both of North Dartmouth; Jay S. Greenspan, South Dartmouth, all of Mass.

[73] Assignee: Isotronics, Inc., New Bedford, Mass.

[21] Appl. No.: 359,209

[22] Filed: Mar. 18, 1982

[51] Int. Cl.³ .............................................. H05K 5/04
[52] U.S. Cl. ................... 174/52 FP; 29/879; 29/884; 339/14 R; 357/65; 357/74; 174/50.6; 174/51
[58] Field of Search ............ 174/52 FP, 52 H, 51, 174/50.52, 50.6, 50.61, 50.63; 339/14 R; 361/399, 302; 357/74, 65; 29/879, 884; 228/122, 189

[56] References Cited

U.S. PATENT DOCUMENTS 3,311,798   3/1967   Gray .............................. 357/74 X
3,548,076  12/1970   Cooke ........................... 174/52 FP Primary Examiner—J. V. Truhe
Assistant Examiner—D. A. Tone
Attorney, Agent, or Firm—Weingarten, Schurgin, Gagnebin & Hayes

[57] ABSTRACT

A microcircuit package in which one or more leads can be grounded to the package by a simple procedure which is performed on a package of usual construction. A braze preform is placed over a lead to be grounded, a metal washer is disposed over the lead and preform, and the assembly is brazed to cause fusing of the washer to the lead and to the header to provide a low resistance grounding connection between the lead and package.

9 Claims, 6 Drawing Figures

LEAD GROUNDING

FIELD OF THE INVENTION

This invention relates to microcircuit packages, and more particularly to a package having hermetically sealed leads, selected ones of which are grounded to the package housing.

BACKGROUND OF THE INVENTION

Microcircuit packages often include electrical leads which extend through a package wall and which are hermetically sealed by glass seals within openings in the package wall. Such packages are available in a variety of configurations such as dual-in-line headers having two parallel arrays of leads which extend orthogonally from the mounting surface of the header, and flat packs which include outwardly extending leads in a plane parallel to the mounting surface. The leads are each electrically insulated from the package by the respective glass seal. It is often required that one or more leads be electrically grounded to the package, and such grounding has been provided heretofore by the fabrication of a special package which includes the one or more grounded leads. In a known technique for fabricating a grounded lead package, a tube of material compatible with the base metal of the package is provided in the opening for the lead which is to be grounded, and a ground pin is inserted through the tube. This procedure is performed prior to glass sealing. Thereafter, the package is brazed to cause sealing of the nongrounded leads and sealing and grounding of the lead and tube structure. This grounding technique is provided as a special custom fabrication for a particular package configuration and is of considerably greater expense than the fabrication of a standard microcircuit package having all nongrounded leads.

SUMMARY OF THE INVENTION

In accordance with this invention, a microcircuit package is provided in which any one or more of the leads can be grounded to the package by a simple procedure which is performed on a package of usual construction. A braze preform is placed over a lead to be grounded, and a metal washer is disposed around the lead and over the preform and is of a metal compatible with that of the header. The package is brazed to cause fusing of the washer to the lead and to the header to provide a low resistance grounding connection between the lead and the package. For packages in which the glass seal protrudes from the package wall, the washer can be cup-shaped to conform to the protruding glass seal. Where multiple leads are to be grounded, the same procedure is followed for each such lead, and the package is brazed as a final step to fuse all of the grounded leads. The hermeticity of the lead seals is not affected by the grounding procedure.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
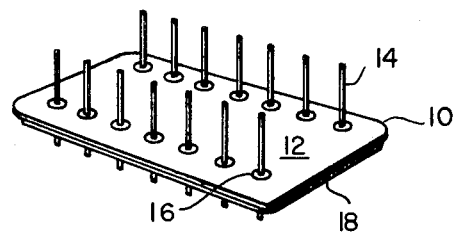
FIG. 1 is a pictorial view of a dual-in-line microcircuit package having a grounded lead according to the invention.

Referring to FIG. 1 of the drawing, there is shown a dual in-line header 10 which includes a generally rectangular metal plate 12, typically gold-plated Kovar, and a plurality of leads 14 extending therethrough and retained within respective openings in the plate by glass-to-metal seals 16. The leads 14 are typically fabricated of Kovar and are electrically insulated from the header plate and hermetically sealed by the glass-to-metal seals. In the illustrated embodiment, the leads are of dual in-line configuration; it will be appreciated that various other lead configurations can be employed to suit particular package or pin configurations. One or more microcircuits are supported on the mounting surface 18 of the header plate 12, and the contact areas of the circuits are electrically connected to the respective ends of leads 14 by wire bonding. The package is enclosed with a cover which is welded or otherwise bonded to the periphery of the header plate. The package itself and the manner of circuit connection is known in the art.

Figure 2:
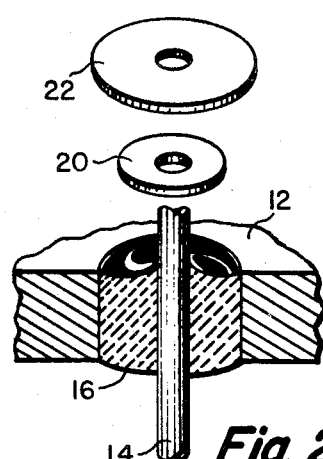
FIG. 2 is an exploded view illustrating the components of the grounded lead package prior to assembly.

It is often required that one or more leads be electrically grounded to the header, and in accordance with the invention, the grounding of a lead or plurality of leads is accomplished in the following manner, with reference to FIGS. 2 and 3. A braze preform ring 20 or washer is placed over a lead 14 to be grounded and is supported on the confronting surface of the header plate and glass seal. The preform has an inside diameter sufficient to slidably fit over the lead, and is of a size providing sufficient filler material to effect the intended braze fillet. A metal washer 22 is disposed around the lead to be grounded and rests on the preform 20. The metal washer 22 has an inside diameter to slidably fit over the lead and an outside diameter greater than that of the header opening through which the lead extends, and is of a metal compatible with that of the header material. This assembly is brazed to cause fusing of the washer to the lead and to the header to provide the low resistance grounding connection between the lead and the header.

Figure 3:
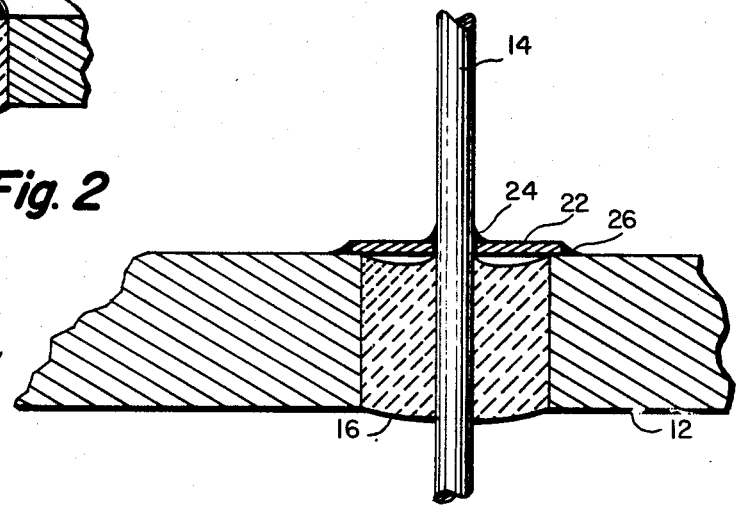
FIG. 3 is a cutaway elevation view of a lead grounded to the microcircuit package according to the invention.

As seen in FIG. 3, a brazed fillet 24 is formed between washer 22 and lead 14, and a brazed fillet 26 is formed between washer 22 and the confronting portion of header 12, thereby forming a conductive interconnection from the lead 14 to the header 12. The grounding of the lead does not affect the integrity of the glass seal 16 and therefore the hermeticity of the header is not affected.

As an example, for a pin diameter of 0.018", the washer can have an outside diameter of 0.060", an inside diameter of 0.020", and a 0.003" thickness. The washer can be formed of Grade A nickel, copper, or Kovar, as examples, and is plated with 25 to 50 microinches of gold. The braze preform is typically 88% gold, 12% germanium. Brazing is accomplished at about 375°–425° C. depending on the size of the part and the mass of the fixtures, and typically is accomplished in a continuous belt furnace operating at 3 inches per minute with a hydrogen/nitrogen atmosphere. Time at braze temperature is approximately two minutes, with the total time in the heating zone being about 12 minutes. The technique for grounding of the lead to the header does not affect the hermeticity of the lead bonded to the header. Other braze filler materials that can be used, for example, are 82% gold/18% tin fired at between 340°–390° C.

Figure 4:
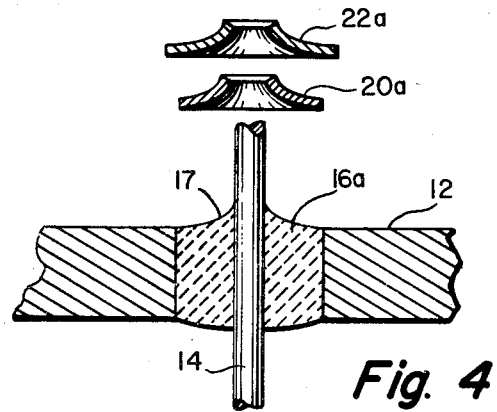
FIG. 4 is a cutaway exploded elevation view of an alternative embodiment having a cup-shaped grounding washer.

In some microcircuit packages the glass seal protrudes from the header or package wall as illustrated in FIG. 4 wherein the glass seal 16a includes a protruding portion 17 which outwardly extends along the length of lead 14 and which is generally of conical configuration. The braze preform 20a and washer 22a in this embodiment have flared cross-sections which conform to the protruding glass seal 16a. The preform 20a is fitted over the lead 14 onto the glass seal 16a and header 12, and the conductive washer 22a is fitted over the lead onto the preform. As described above, the assembly is brazed to cause fusing of the washer 22a to the lead and to the header to provide the conductive grounding connection.

Figure 5:
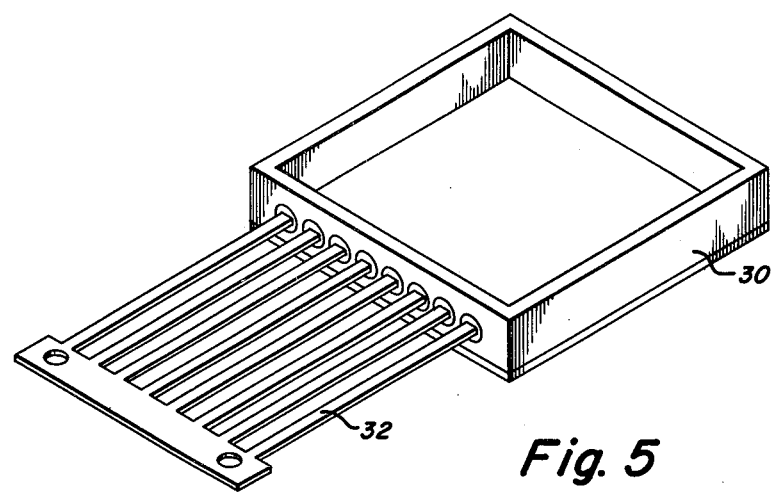
FIG. 5 is a pictorial view of a flatpack microcircuit package having a rectangular lead grounded according to the invention.
Figure 6:
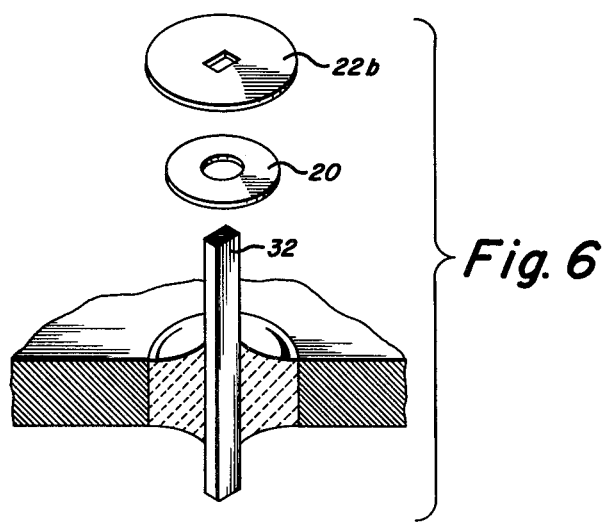
FIG. 6 is an exploded view illustrating the components of the grounded lead flat pack according to the invention.

As discussed, the invention is also useful with other lead configurations such as shown in FIGS. 5 and 6. Referring to FIG. 5, there is shown a flat pack 30 having rectangular leads 32 with typical dimensions of 0.010"×0.015". As seen in FIG. 6, the washer 22b has a rectangular opening conforming to the configuration of lead 32 to effect good brazing of the components.

The invention is not to be limited by what has been particularly shown and described except as indicated in the appended claims.

What is claimed is:

1. In a microcircuit package which includes a conductive header and a plurality of leads each extending through a respective opening and retained in the opening and electrically insulated from the header by glass seals, means for grounding one or more leads to the header comprising for each such lead:
    a braze preform ring disposed over the lead and having an opening to slidably fit over the lead, and sufficient material to provide a braze fillet;
    a metal washer disposed around the lead and supported on the preform ring, the metal washer having an opening to slidably fit over the lead and an outside diameter larger than that of the header opening to provide a peripheral surface in contact with the confronting peripheral surface of the header;
    the metal washer being of a metal compatible with that of the header material;
    the package being brazable to cause fusing of the washer to the lead and to the header to provide a low resistance grounding connection.

2. The invention of claim 1 wherein the microcircuit package includes a plurality of leads each of circular cross-section;
    and wherein the braze preform ring and metal washer each have an opening with an inside diameter to slidably fit over each such lead.

3. The invention of claim 1 wherein the microcircuit package is a dual in-line package.

4. The invention of claim 1 wherein the braze preform ring is a gold/germanium alloy.

5. The invention of claim 1 wherein the braze preform ring is a gold/tin alloy.

6. The invention of claim 1 wherein the metal washer is selected from the group of metals consisting of nickel, copper, and an alloy consisting of 17 percent cobalt, 54 percent iron, and 29 percent nickel.

7. The invention of claim 1 wherein the microcircuit package includes a glass seal having a protruding portion which outwardly extends along the length of the lead;
    and wherein the braze preform ring and metal washer each have a flared cross-section which conforms to the protruding glass seal.

8. The invention of claim 1 wherein the microcircuit package includes a flat pack having leads of rectangular cross-section;
    and wherein the metal washer has an opening of rectangular configuration conforming to and slidably fitting over the lead.

9. In a method for grounding one or more leads to a header of a microcircuit package of a type which includes a conductive header and a plurality of leads each extending through its respective opening and retained in the opening and electrically insulated from the header by glass seals, the steps of:
    disposing over each lead to be grounded a braze preform ring having an opening to slidably fit over the lead and sufficient material to provide a braze fillet;
    disposing over each lead to be grounded a metal washer having an opening to slidably fit over the lead and an outside diameter greater than that of the header opening to provide a peripheral surface in contact with the confronting peripheral surface of the header, the metal washer being of a metal compatible with that of the header material; and
    brazing the package to cause fusing of the washer to the lead and to the header to provide a low resistance grounding connection.

* * * * *

UNITED STATES PATENT AND TRADEMARK OFFICE
CERTIFICATE OF CORRECTION

PATENT NO.   :   4,453,033
DATED        :   June 5, 1984
INVENTOR(S)  :   Raymond J. Duff et al It is certified that error appears in the above—identified patent and that said Letters Patent is hereby corrected as shown below:

Column 2, line 17, "dual in-line" should read --dual-in-line--;

lines 24-25, "dual in-line" should read --dual-in-line--.

Column 3, line 31, "washer 226" should read --washer 22b--.

Column 4, line 13, "dual in-line" should read --dual-in-line--.

Signed and Sealed this

Nineteenth Day of February 1985

[SEAL]

Attest:

DONALD J. QUIGG

Attesting Officer          Acting Commissioner of Patents and Trademarks